United States Patent
Wan et al.

(10) Patent No.: US 10,020,383 B2
(45) Date of Patent: Jul. 10, 2018

(54) PRESERVING THE SEED LAYER ON STI EDGE AND IMPROVING THE EPITAXIAL GROWTH

(71) Applicant: GLOBALFOUNDRIES Inc., Grand Cayman (KY)

(72) Inventors: Jing Wan, Malta, NY (US); Jer-Hueih(James) Chen, Waterford, NY (US); Cuiqin Xu, Malta, NY (US); Padmaja Nagaiah, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 40 days.

(21) Appl. No.: 14/716,938

(22) Filed: May 20, 2015

(65) Prior Publication Data

US 2016/0343607 A1 Nov. 24, 2016

(51) Int. Cl.

| | | |
|---|---|---|
| H01L 29/78 | (2006.01) | |
| H01L 21/336 | (2006.01) | |
| H01L 29/66 | (2006.01) | |
| H01L 21/28 | (2006.01) | |
| H01L 29/06 | (2006.01) | |
| H01L 29/08 | (2006.01) | |
| H01L 29/165 | (2006.01) | |
| H01L 21/762 | (2006.01) | |
| H01L 21/308 | (2006.01) | |

(52) U.S. Cl.
CPC .. H01L 29/66795 (2013.01); H01L 21/28008 (2013.01); H01L 21/76232 (2013.01); H01L 29/0653 (2013.01); H01L 29/0847 (2013.01); H01L 29/165 (2013.01); H01L 29/66636 (2013.01); H01L 29/7848 (2013.01); H01L 29/7851 (2013.01); H01L 21/3083 (2013.01)

(58) Field of Classification Search
CPC ...................... H01L 29/66636; H01L 29/7848
See application file for complete search history.

(56) References Cited

U.S. PATENT DOCUMENTS

2013/0240956 A1* 9/2013 Hou .................. H01L 21/76224
257/288
2013/0240988 A1* 9/2013 Griebenow ....... H01L 21/28518
257/333

(Continued)

*Primary Examiner* — Steven Loke
*Assistant Examiner* — Scott Stowe
(74) *Attorney, Agent, or Firm* — Ditthavong & Steiner, P.C.

(57) ABSTRACT

A method of forming self-aligned STI regions extending over portions of a Si substrate to enable the subsequent formation of epitaxially grown embedded S/D regions without using a lithography mask and the resulting device are provided. Embodiments include forming a STI etch mask with laterally separated openings over a Si substrate; forming shallow trenches into the Si substrate through the openings; forming first through fourth oxide spacers on opposite sidewalls of the shallow trenches and the openings; forming a deep STI trench between the first and second oxide spacers and between the third and fourth oxide spacers down into the Si substrate; forming a STI oxide layer over the first through fourth oxide spacers and a portion of the STI etch mask, the STI oxide layer filling the deep STI trenches; and planarizing the STI oxide layer down to the portion of the STI etch mask.

7 Claims, 10 Drawing Sheets

(56) References Cited

U.S. PATENT DOCUMENTS

2014/0021517 A1\* 1/2014 Cheng ................ H01L 29/6656
  257/288
2014/0353741 A1\* 12/2014 Montanini ........ H01L 29/66636
  257/327

\* cited by examiner

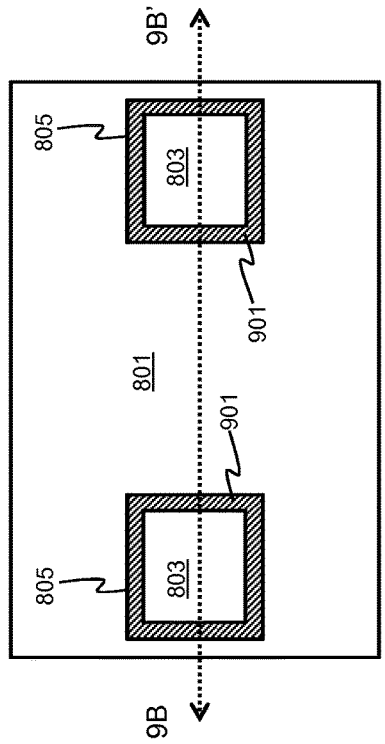
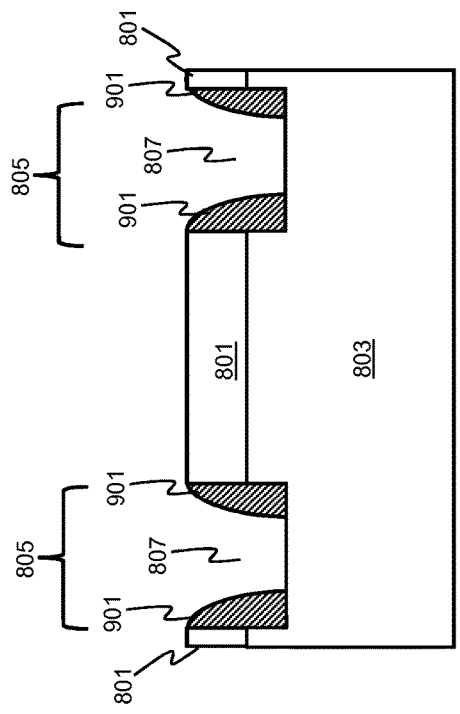
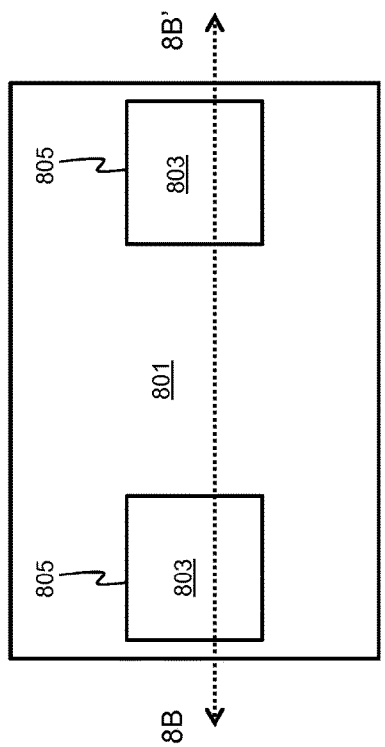
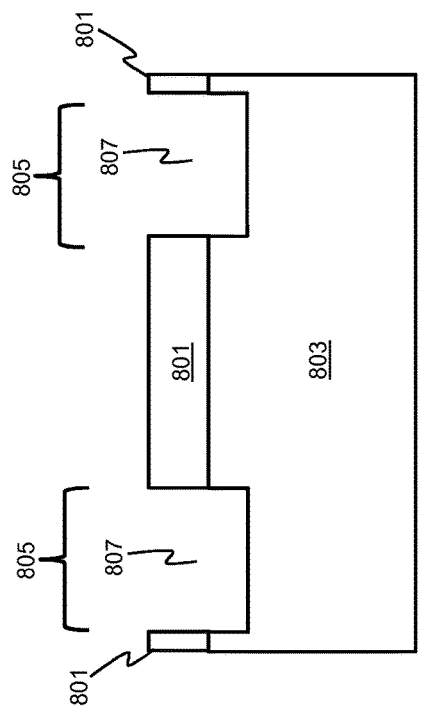

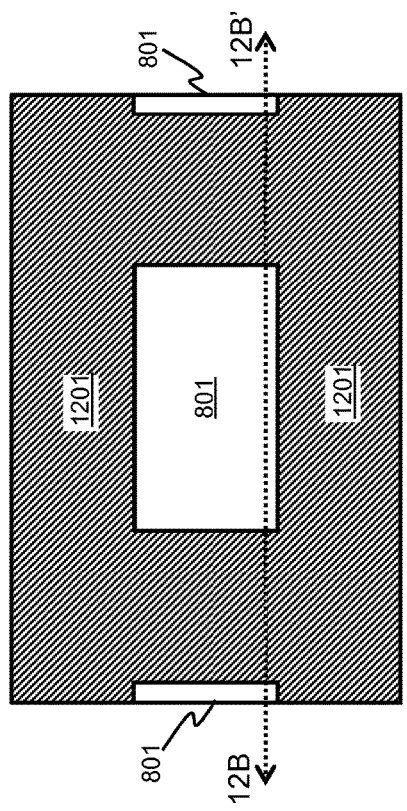
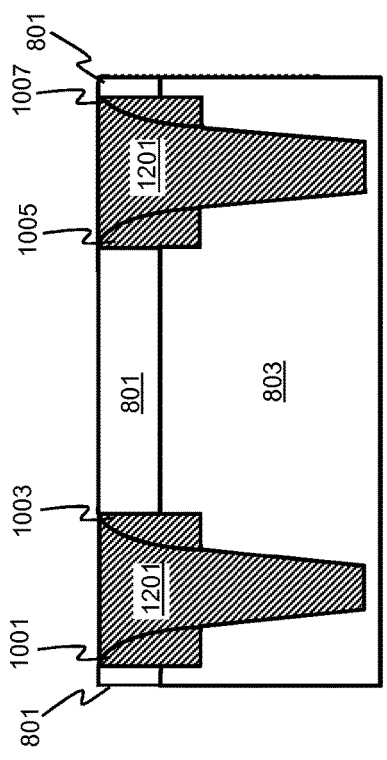
FIG. 12A
FIG. 12B

US 10,020,383 B2

PRESERVING THE SEED LAYER ON STI EDGE AND IMPROVING THE EPITAXIAL GROWTH

TECHNICAL FIELD

The present disclosure relates to forming source/drain (S/D) regions by epitaxial (EPI) growth for both planar and field-effect transistor (FinFET) devices. The present disclosure is particularly applicable to epitaxially grown S/D regions.

BACKGROUND

A known approach for forming epitaxially grown silicon germanium (eSiGe) S/D regions for both planar and FinFET devices is illustrated in FIGS. 1, 2A, 2B, 2C, and 3. Adverting to FIG. 1, shallow trench isolation (STI) structures 101 are formed on opposite sides of a silicon (Si) substrate 103. A gate structure 105 is formed between the STI structures 101 on the Si substrate 103. Sigma-shaped cavities 201, box-shaped cavities 221, or ball-shaped cavities 231 are then formed in the Si substrate 103 by etching, as depicted in the FIGS. 2A, 2B, and 2C, respectively. Since SiGe does not grow on the STI dielectric, incomplete eSiGe S/D regions 301 are formed in the ball-shaped cavities 231, for example, as depicted in FIG. 3.

Another known approach for forming eSiGe S/D regions for both planar and FinFET devices is illustrated in FIGS. 4A through 7B. Adverting to FIGS. 4A and 4B (FIG. 4A is a top view and FIG. 4B is a cross-sectional view along the line 4B-4B'), a STI etch mask 401 is formed, for example, of nitride, over a Si substrate 403. STI deep trenches 405 are then formed in the Si substrate 403. An organic planarization layer (OPL) 501 is formed over the STI etch mask 401, filling the STI deep trenches 405, as depicted in FIG. 5B (FIG. 5A is a top view and FIG. 5B is a cross-sectional view along the line 5B-5B'). A silicon-containing anti-reflective coating (SiARC) layer 503 is then formed over the OPL layer 501. Next, a photoresist layer 505 is formed over the SiARC layer 503, as depicted in FIG. 5A. The photoresist layer 505 is formed with openings 507 over the now filled STI deep trenches 405. The openings 507 are formed slightly wider than the width of the STI deep trenches 405.

Adverting to FIGS. 6A and 6B (FIG. 6A is a top view and FIG. 6B is a cross-sectional view along the line 6B-6B'), the SiARC layer 503, the OPL layer 501, the STI etch mask 401, and a portion of the Si substrate 403 are then etched through openings 507 in the photoresist layer 505 to form shallow trenches 601. Then, the photoresist layer 505 and the SiARC layer 503 are removed. Next, the OPL layer 501 is removed, as depicted in FIGS. 7A and 7B. FIG. 7A is a top view and FIG. 7B is a cross-sectional view along the line 7B-7B'. A STI oxide layer 701 is then formed over the STI etch mask 401, filling the shallow trenches 601 and STI deep trenches 405. Thereafter, the STI oxide layer 701 is planarized, e.g., by chemical mechanical polishing (CMP), down to the STI etch mask 401. Consequently, a portion of the STI oxide layer 701 extends over the Si substrate 403 and, therefore, protects the Si substrate 403 underneath from etching. The extended portion of the STI oxide layer 701 enables the preserved Si to function as a seed layer for subsequent formation of the eSiGe S/D regions. However, this known approach requires an extra masking step and lithography, which increases overall processing costs.

A need therefore exists for methodology enabling the preservation of Si adjacent STI regions for subsequent epitaxial growth of complete S/D regions and the resulting device.

SUMMARY

An aspect of the present disclosure is a process of forming self-aligned STI regions extended over portions of a Si substrate to enable the subsequent epitaxial growth of complete S/D regions without using a lithography mask.

Another aspect of the present disclosure is a transistor device having STI regions extended over portions of a Si substrate and fully formed epitaxially grown S/D regions.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: An aspect of the present disclosure is a method including: forming a STI etch mask over a Si substrate, the STI etch mask having laterally separated openings on opposite sides of the Si substrate; forming shallow trenches in a portion of the Si substrate through the openings; forming first, second, third, and fourth oxide spacers on opposite sidewalls of the shallow trenches and the openings; forming a deep STI trench between the first and second oxide spacers and between the third and fourth oxide spacers down through a portion of the Si substrate; forming a STI oxide layer over the first, second, third, and fourth oxide spacers and a portion of the STI etch mask, the STI oxide layer filling the deep STI trenches; and planarizing the STI oxide layer down to the portion of the STI etch mask.

Aspects of the present disclosure include forming the STI etch mask of nitride. Other aspects include forming the STI etch mask to a thickness of 10 nanometer (nm) to 100 nm. Further aspects include forming the openings with a width of 20 nm to 200 nm. Additional aspects include forming the first, second, third, and fourth oxide spacers by: forming an oxide layer along the sidewalls of the shallow trenches; and etching the oxide layer down to the Si substrate along a pair of opposite sidewalls. Another aspect includes forming each of the first, second, third, and fourth oxide spacers with a width of 5 nm to 100 nm. Other aspects include forming the deep STI trenches by: removing the STI etch mask except adjacent to the first oxide spacer, but opposite the second oxide spacer; between the second and third oxide spacers; and adjacent to the fourth oxide spacer, but opposite the third oxide spacer, the portion of the STI etch mask remaining; etching the substrate between the first and second oxide spacers and between the third and fourth oxide spacers to a depth of 100 nm to 500 nm; and etching opposite sidewalls of the deep STI trenches at a 70° to 90° angle.

Another aspect of the present disclosure is a method including: forming STI structures in a Si substrate, the STI structures laterally separated; forming a spacer material layer over each STI structure and extending over a portion of the Si substrate; forming a gate structure on the Si substrate equidistant between the spacer material layers; forming a photoresist over each of the spacer material layers; forming a first cavity in the Si substrate between each spacer material layer and the gate structure, the first cavity formed under an equal portion of the spacer material layer and the gate structure; forming a second cavity in the Si substrate through the first cavity, the second cavity formed under an equal portion of the spacer material layer and the gate structure; and forming an epitaxial layer in the second cavity, the epitaxial layer formed higher than the spacer.

Aspects of the present disclosure include forming the spacer material layer of nitride. Other aspects include forming the spacer to a thickness of 3 nm to 30 nm. Further aspects include forming the spacer material layer extending 5 nm to 50 nm over the portion of the Si substrate. Additional aspects include forming the first and second cavities as box-shaped cavities. Another aspect includes forming the first cavity in the Si substrate to a depth of 5 nm to 50 nm. Other aspects include forming the first cavity by: dry etching. Further aspects include forming the second cavity by: wet etching.

A further aspect of the present disclosure is a transistor device including: a Si substrate; a gate structure formed on the Si substrate; STI structures formed in the Si substrate on opposite sides of the gate structure; seed layer protection structures formed over the Si substrate on opposite sides of the gate structure; and epitaxial structures formed in the Si substrate under the seed protection structure and the gate structure, the epitaxial structures formed on opposite sides of the gate structure.

Aspects of the device include the seed protection structure being formed as part of the STI structure. Other aspects include the seed protection structure being formed as a nitride spacer material layer over the STI structure and extending over a portion of the Si substrate. Further aspects include the epitaxial structure being formed in a box-shaped, sigma-shaped, or ball-shaped cavity in the Si substrate. Additional aspects include the epitaxial structure being formed higher than the seed protection structure.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 4A through 7A and 4B through 7B schematically illustrate top and cross-sectional views, respectively, of a background process flow for forming STI regions extended over portions of a Si substrate to enable subsequent formation of eSiGe S/D regions;

FIGS. 8A through 12A and 8B through 12B schematically illustrate top and cross-sectional views, respectively, of a process flow for forming self-aligned STI regions extended over portions of a Si substrate to enable subsequent formation of eSiGe S/D regions without using a lithography mask, in accordance with an exemplary embodiment.

DETAILED DESCRIPTION

Figure 1:
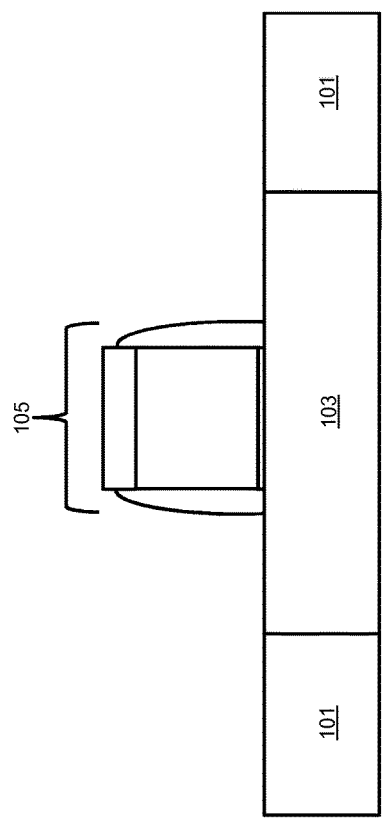
FIGS. 1, 2A, 2B, 2C, and 3 schematically illustrate a background process flow for forming an untucked transistor device.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of the EPI seed layer adjacent STI regions being removed by etching, causing incomplete S/D formation, attendant upon forming epitaxially grown S/D regions in a planar or FinFET device.

Methodology in accordance with embodiments of the present disclosure includes forming a STI etch mask over a Si substrate, the STI etch mask having laterally separated openings on opposite sides of the Si substrate. Shallow trenches are formed in a portion of the Si substrate through the openings. First, second, third, and fourth oxide spacers are formed on opposite sidewalls of the shallow trenches and the openings. A deep STI trench is formed between the first and second oxide spacers and between the third and fourth oxide spacers down through a portion of the Si substrate. A STI oxide layer is formed over the first, second, third, and fourth oxide spacers and a portion of the STI etch mask, the STI oxide layer filling the deep STI trenches. The STI oxide layer is planarized down to the portion of the STI etch mask.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 8A through 12B schematically illustrate a process flow for forming self-aligned STI regions extended over portions of a Si substrate to enable subsequent formation of eSiGe S/D regions without using a lithography mask, in accordance with an exemplary embodiment. Adverting to FIGS. 8A and 8B (FIG. 8A is a top view and FIG. 8B is a cross-sectional view along the line 8B-8B'), a STI etch mask 801 is formed over the Si substrate 803, the STI etch mask 801 having laterally separated openings 805 on opposite sides of the Si substrate 803. The STI etch mask 801 may be formed, for example, of nitride. The STI etch mask 801 also may be formed, for example, to a thickness of 10 nm to 100 nm. Each opening 805 may be formed, for example, to a width of 20 nm to 200 nm. Shallow trenches 807 are then formed in a portion of the Si substrate 803 through the openings 805.

Figure 10A:
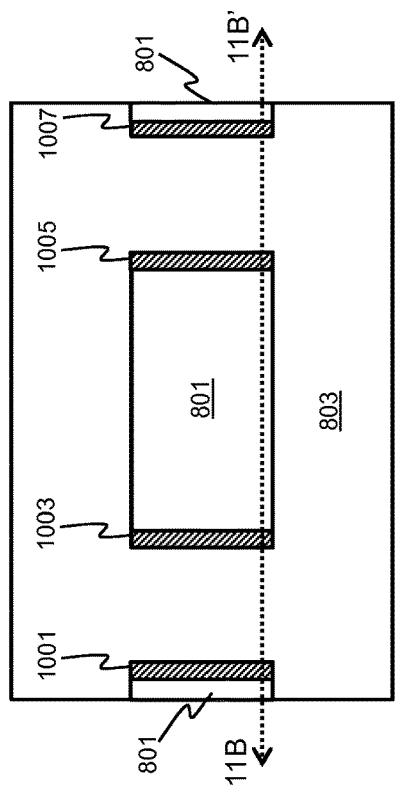
Figure 10B:
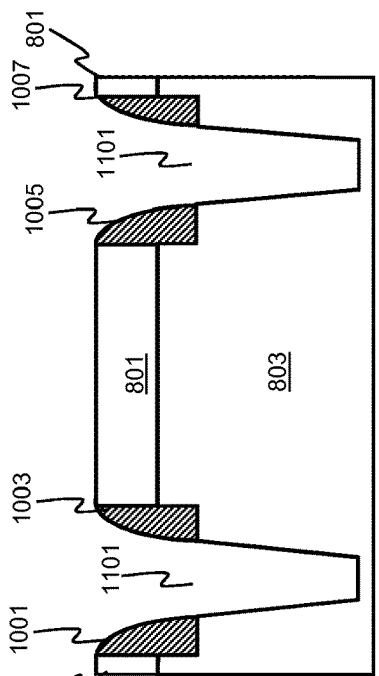

Self-aligned spacers 901 are formed on the sidewalls of the shallow trenches 807 and the openings 805 of the STI etch mask 801, as depicted in FIGS. 9A and 9B. FIG. 9A is a top view and FIG. 9B is a cross-sectional view along the line 9B-9B' and, for example, of oxide. The spacers 901 may also be formed, for example, with a width of 5 nm to 100 nm. Adverting to FIGS. 10A and 10B (FIG. 10A is a top view and FIG. 10B is a cross-sectional view along the line 10B-10B'), the spacers 901 are etched, for example, down to the Si substrate 803 along a pair of opposite sidewalls leaving spacers 1001, 1003, 1005, and 1007. The STI etch mask 801 is then removed except for the portions adjacent to the spacer 1001, but opposite the spacer 1003; between the spacers 1003 and 1005; and adjacent to the spacer 1007, but opposite from the spacer 1005.

Figure 11A:
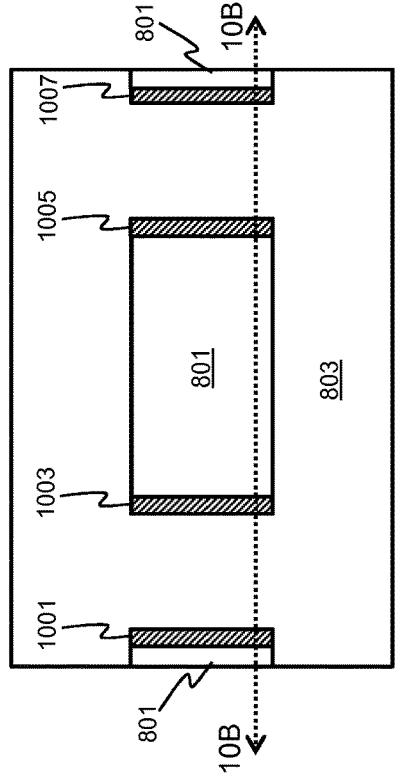
Figure 11B:
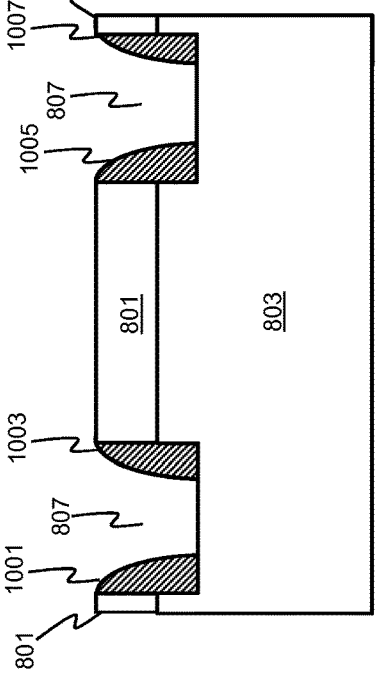

Deep STI trenches 1101 are formed, for example, by etching the Si substrate 803 through the shallow trenches 807 between the spacers 1001 and 1003 and 1005 and 1007, as depicted in FIGS. 11A and 11B. FIG. 11A is a top view and FIG. 11B is a cross-sectional view along the line 11B-11B'. The deep STI trenches 1101 may be formed, for example, in the Si substrate 803 to a depth of 100 nm to 500 nm. The deep STI trenches 1101 may also be formed, for example, by etching opposite sidewalls of the deep STI trenches 1101 at a 70° to 90° angle. Adverting to FIGS. 12A and 12B (FIG. 12A is a top view and FIG. 12B is a cross-sectional view along the line 12B-12B'), a STI oxide layer 1201 is formed over the spacers 1001, 1003, 1005, and 1007 and the remaining portions of the STI etch mask 801, the STI oxide layer 1201 filling the deep STI trenches 1101. The STI oxide layer 1201 is then planarized, for example, by CMP, down to the STI etch mask 801. Consequently, the spacers and STI oxide preserve the EPI seed layer and, therefore, enable the subsequent formation of eSiGe S/D regions.

FIGS. 13 through 16 schematically illustrate another process flow for using spacers to protect the EPI seed layer for subsequent formation of eSiGe S/D regions, in accordance with another exemplary embodiment. Adverting to FIG. 13, laterally separated STI structures 1301 are formed in a Si substrate 1303. A gate structure 1305 is formed on the Si substrate 1303 equidistant between the STI structures 1301. A spacer material layer 1307 is then formed over each STI structure 1301 and extending over a portion of the Si substrate 1303 as highlighted by the dashed circles 1309. The spacer material layer 1307 may be formed, for example, to extend 5 nm to 50 nm over the portion of the Si substrate 1303. Each spacer material layer 1307 may also be formed, for example, to a thickness of 3 nm to 30 nm. Further, each spacer material layer 1307 may be formed, for example, of nitride. Thereafter, a photoresist 1311 is formed over each spacer material layer 1307.

Figure 2A:
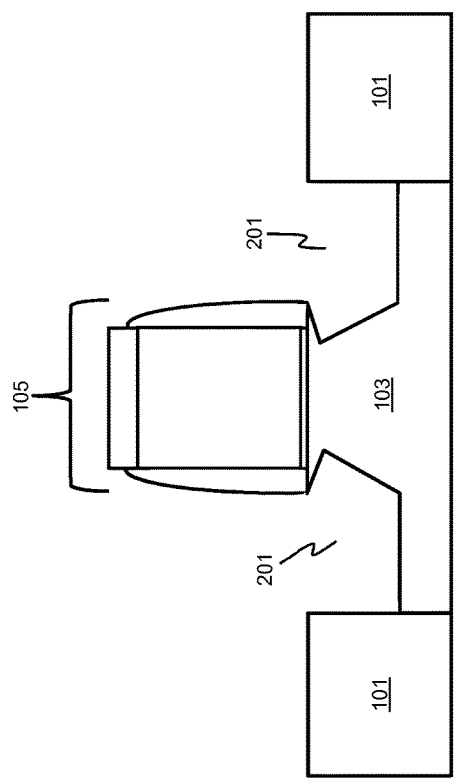
Figure 2B:
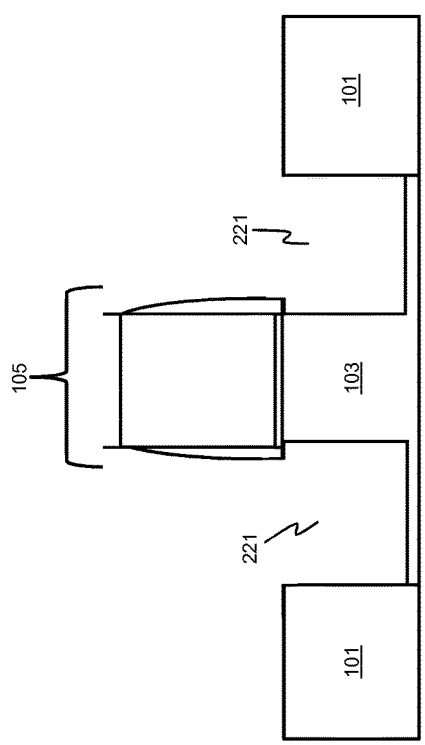
Figure 2C:
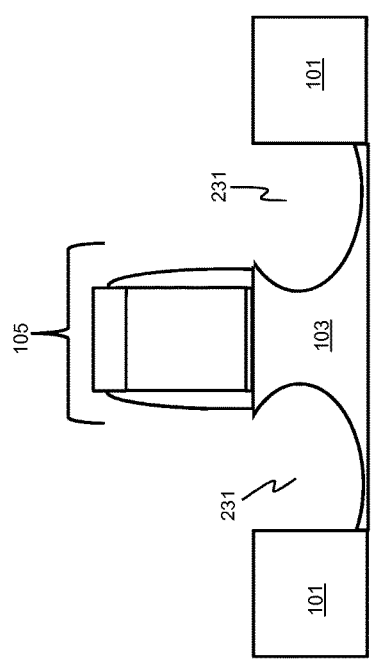
Figure 3:
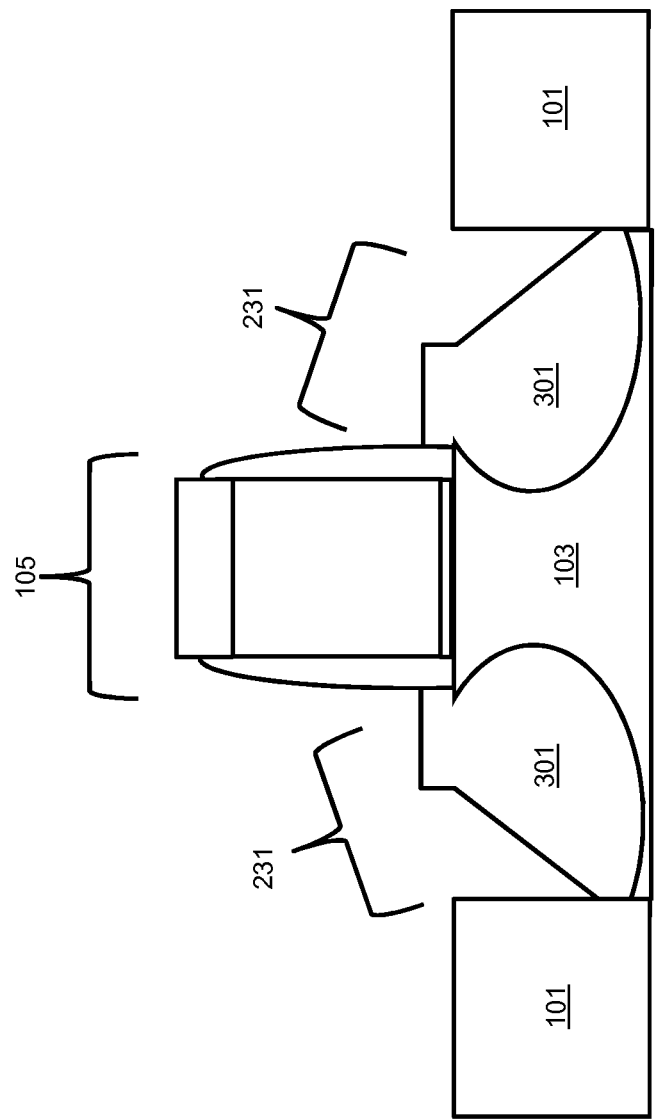
Figure 5A:
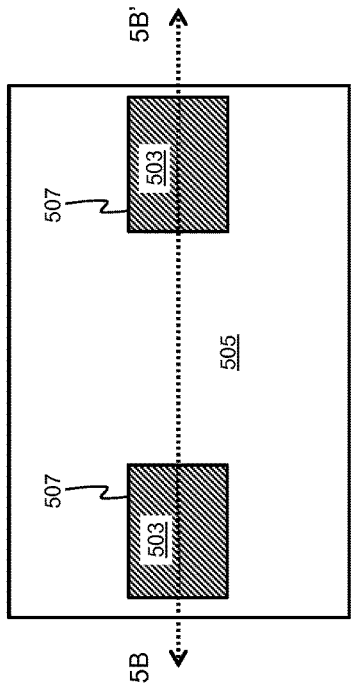
Figure 5B:
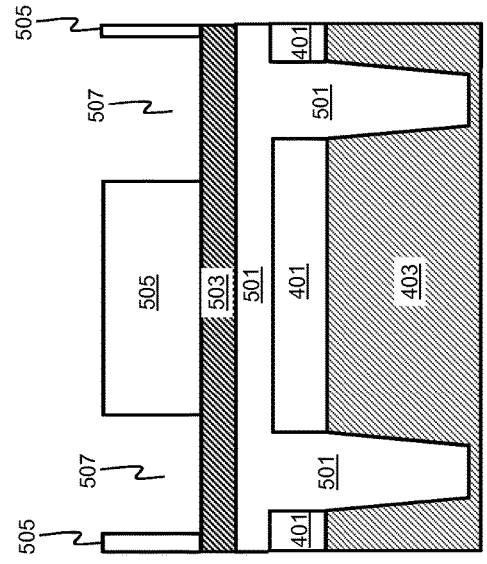
Figure 4A:
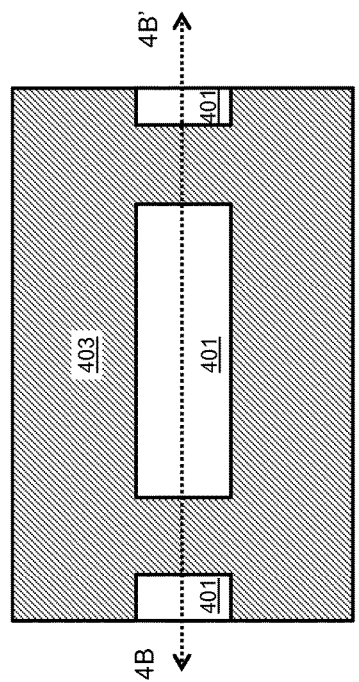
Figure 4B:
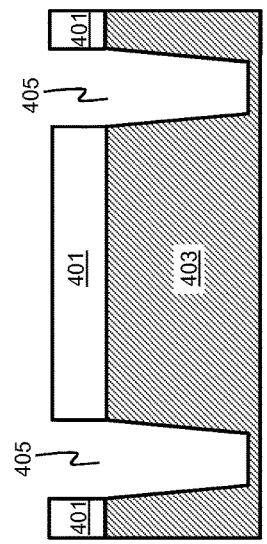
Figure 6A:
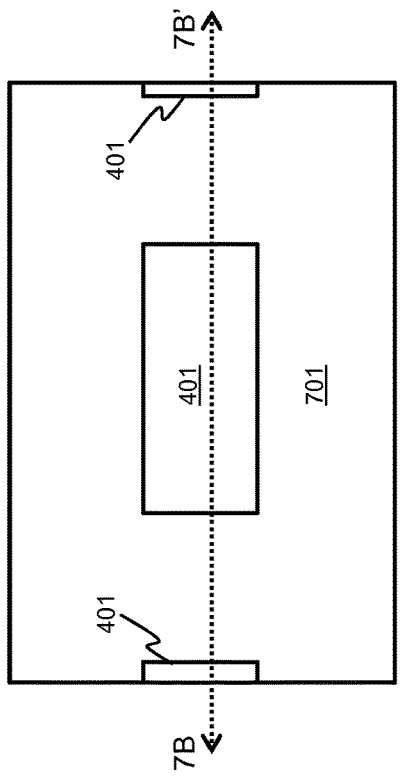
Figure 7A:
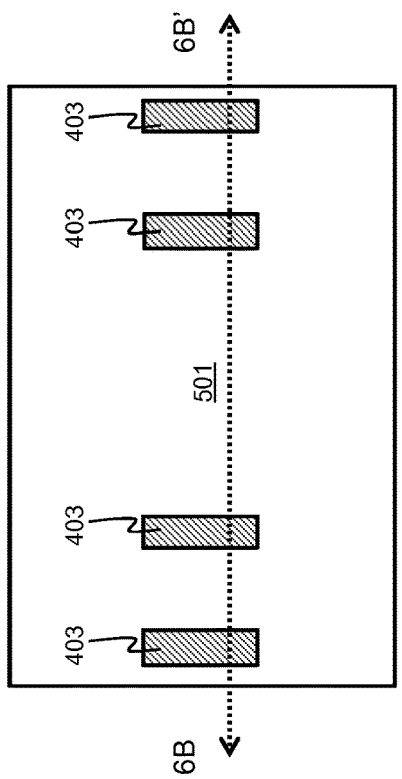
Figure 6B:
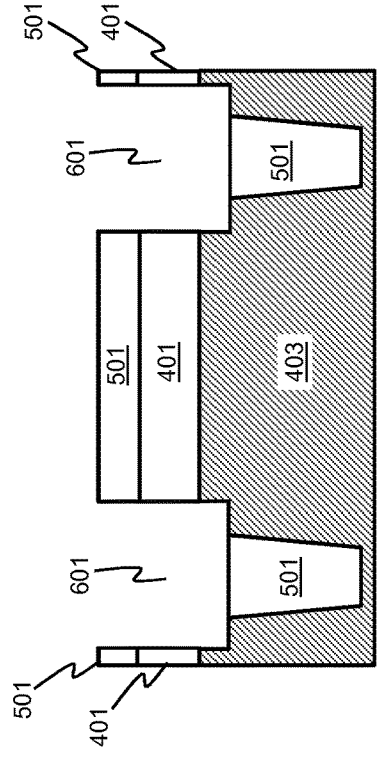
Figure 7B:
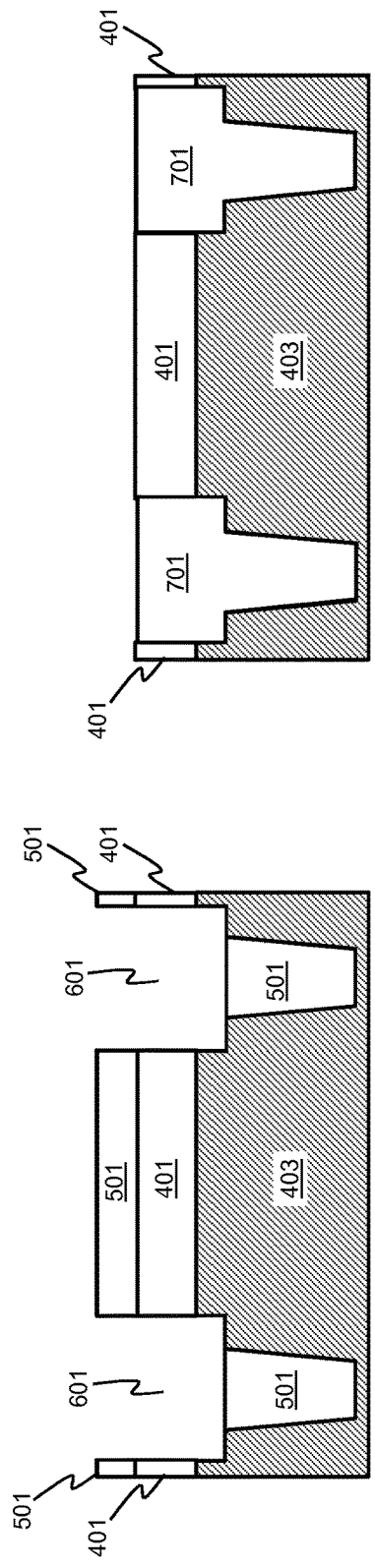
Figure 14:
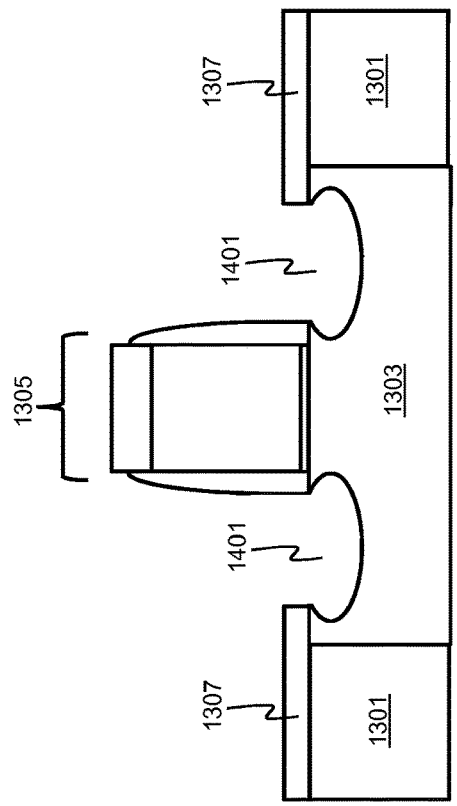
FIGS. 13 through 16 schematically illustrate a process flow for using spacers to protect underlying portions of a Si substrate to enable subsequent formation of eSiGe S/D regions, in accordance with another exemplary embodiment.
Figure 13:
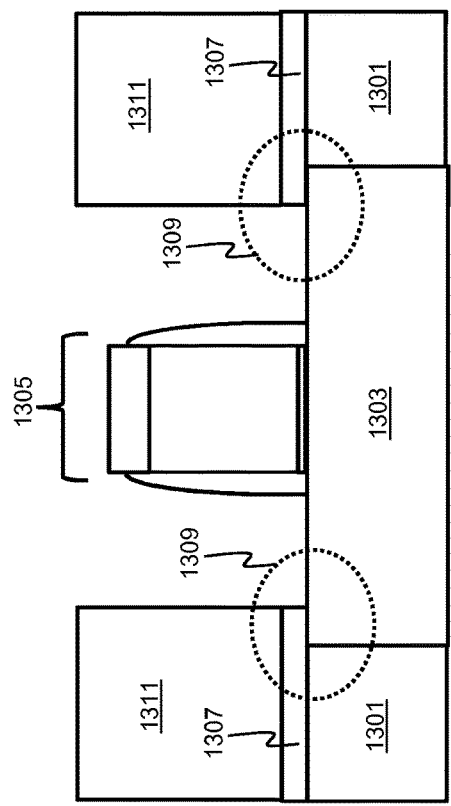
Figure 16:
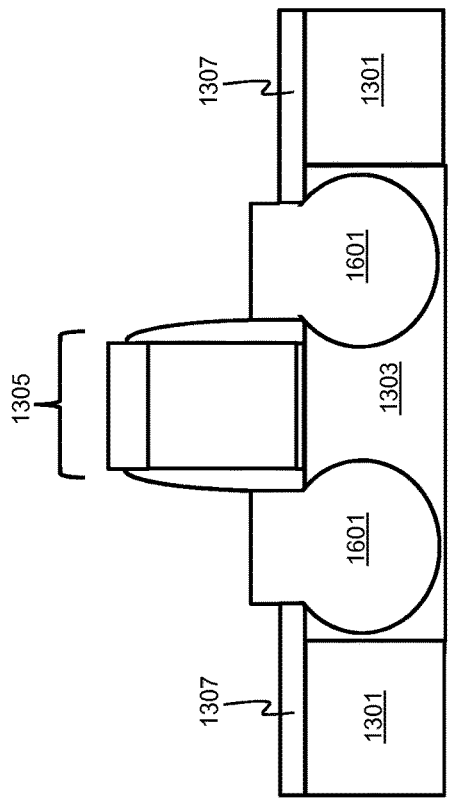
Figure 15:
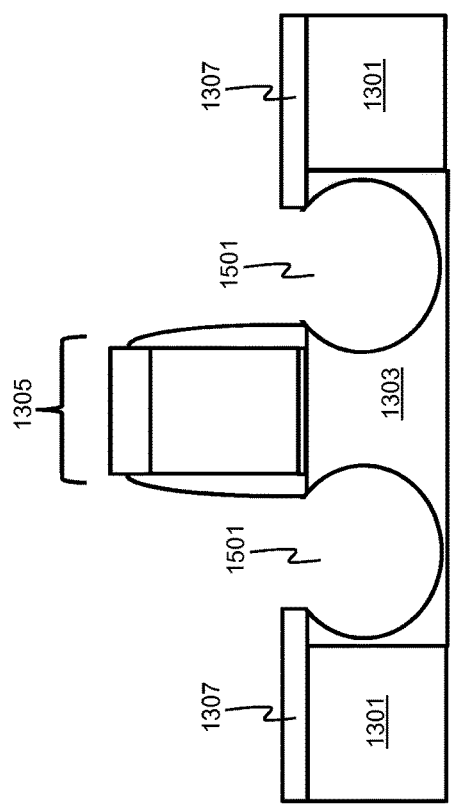

Adverting to FIG. 14, a cavity 1401 is formed in the Si substrate 1303 between each spacer material layer 1307 and the gate structure 1305. The cavities 1401 are formed under equal portions of the spacer material layer 1307 and the gate structure 1305. The cavities 1401 may be formed, for example, to a depth of 5 nm to 50 nm. The cavities 1401 are formed by dry etching. The photoresists 1311 are then removed and cavities 1501 are formed through the cavities 1401, as depicted in FIG. 15. Similar to cavities 1401, the cavities 1501 are also formed under equal portions of the spacer material layers 1307 and the gate structure 1305. In contrast to the formation of the cavities 1401, the cavities 1501 are formed by wet etching. The cavities 1401 and 1501 may each be formed in a box shape as depicted in FIGS. 14 and 15, a Sigma shape as depicted in FIG. 2A, or in ball shape as depicted in FIGS. 2C and 3 depending on the particular technology node and the desired resultant device. Thereafter, an epitaxial layer 1601 is formed in the cavities 1501 higher than the spacers 1305, as depicted in FIG. 16. The epitaxial layer 1601 may be formed, for example, of eSiGe. Consequently, the spacer material layer 1307 protects portions of the Si substrate 1303 from etching during the formation of cavities 1401 and 1501, and the preserved portions of the Si substrate 1303 function as an EPI seed layer for the subsequent formation of the epitaxial layer 1601, i.e., eSiGe S/D regions.

The embodiments of the present disclosure can achieve several technical effects including preserving the EPI seed layer adjacent to STI regions for the subsequent formation of complete epitaxially grown embedded S/D regions without using a lithography mask. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices having epitaxially grown embedded S/D regions.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming shallow trench isolation (STI) structures in a silicon (Si) substrate, the STI structures laterally separated;
    forming a single spacer nitride material layer over each STI structure and extending over a portion of the Si substrate, wherein no intervening layer is present between the single spacer nitride material layer and each STI structure;
    forming a gate structure on the Si substrate equidistant between each single spacer nitride material layer;
    forming a photoresist directly on each single spacer nitride material layer over each STI structure, wherein no intervening layer is present between the single spacer nitride material layer and the photoresist;
    forming a first cavity in the Si substrate between each single spacer nitride material layer and the gate structure, the first cavity formed under an equal portion of the single spacer nitride material layer and the gate structure;
    forming a second cavity in the Si substrate through the first cavity, the second cavity formed under an equal portion of the single spacer nitride material layer and the gate structure; and
    forming an epitaxial layer in the second cavity, the epitaxial layer formed higher than the single spacer nitride material layer.

2. The method according to claim 1, comprising forming the single spacer nitride material layer to a thickness of 3 nanometer (nm) to 30 nm.

3. The method according to claim 1, comprising forming the single spacer nitride material layer extending 5 nm to 50 nm over the portion of the Si substrate.

4. The method according to claim 1, comprising forming the first and second cavities as box-shaped cavities.

5. The method according to claim 1, comprising forming the first cavity in the Si substrate to a depth of 5 nm to 50 nm.

6. The method according to claim 1, comprising forming the first cavity by:
   dry etching.

7. The method according to claim 1, comprising forming the second cavity by:
   wet etching.

* * * * *